(12) United States Patent
Hynecek et al.

(10) Patent No.: US 8,946,845 B1
(45) Date of Patent: Feb. 3, 2015

(54) STACKED PIXELS FOR HIGH RESOLUTION CMOS IMAGE SENSORS WITH BCMD CHARGE DETECTORS

(75) Inventors: Jaroslav Hynecek, Allen, TX (US);
Hirofumi Komori, San Jose, CA (US);
Xia Zhao, Campbell, CA (US)

(73) Assignee: Aptina Imaging Corporation, George Town (KY)

( * ) Notice: Subject to any disclaimer, the term of this patent is extended or adjusted under 35 U.S.C. 154(b) by 523 days.

(21) Appl. No.: 13/153,055

(22) Filed: Jun. 3, 2011

Related U.S. Application Data

(60) Provisional application No. 61/438,853, filed on Feb. 2, 2011.

(51) Int. Cl.
*H01L 27/146* (2006.01)
*H01L 31/113* (2006.01)

(52) U.S. Cl.
USPC .... 257/440; 257/222; 257/233; 257/E27.135; 438/75; 250/208.1

(58) Field of Classification Search
USPC ......... 257/222, 225, 228, 229, 233, 292–293, 257/E27.132, E27.135; 250/208.1; 438/75
See application file for complete search history.

(56) References Cited

U.S. PATENT DOCUMENTS

| | | | |
|---|---|---|---|
| 3,971,065 A | 7/1976 | Bayer | |
| 5,317,174 A * | 5/1994 | Hynecek | 257/222 |
| 5,369,047 A * | 11/1994 | Hynecek | 438/60 |
| 6,243,434 B1 * | 6/2001 | Hynecek | 377/60 |
| 6,657,665 B1 | 12/2003 | Guidash | |
| 6,882,022 B2 * | 4/2005 | Hynecek | 257/461 |
| 6,894,265 B2 * | 5/2005 | Merrill et al. | 250/208.1 |
| 7,064,406 B2 * | 6/2006 | Mouli | 257/446 |
| 7,400,022 B2 * | 7/2008 | Tishin et al. | 257/440 |
| 7,622,758 B2 * | 11/2009 | Hynecek | 257/292 |
| 7,737,475 B2 | 6/2010 | Hynecek | |
| 2005/0051808 A1 * | 3/2005 | Hynecek | 257/225 |
| 2005/0156264 A1 * | 7/2005 | Sakano et al. | 257/432 |
| 2007/0023801 A1 * | 2/2007 | Hynecek | 257/292 |
| 2008/0185619 A1 * | 8/2008 | Merrill | 257/292 |
| 2009/0302358 A1 * | 12/2009 | Mao et al. | 257/292 |
| 2011/0068251 A1 * | 3/2011 | Narui | 250/208.1 |

* cited by examiner

*Primary Examiner* — Cheung Lee
*Assistant Examiner* — Jeremy Joy

(57) ABSTRACT

The invention describes in detail a solid-state CMOS image sensor, specifically a CMOS image sensor pixel that has stacked photo-sites, high sensitivity, and low dark current. The pixels have incorporated therein special potential barriers under the standard pinned photodiode region that diverts the photo-generated electrons from a deep region within the silicon bulk to separate storage structures located at the surface of the silicon substrate next to the pinned photodiode. The storage structures are p channel BCMD transistors that are biased to a low dark current generation mode during a charge integration period. The signal readout from the BCMD is nondestructive, therefore, without kTC noise generation. Thus a single pixel is capable of detecting several color-coded signals while using fewer or without using any light absorbing color filters on top of the pixel. The image sensors constructed with the stacked photo-sites with BCMD readout have higher pixel densities, higher resolution, higher sensitivity, very low dark current, and no color aliasing if at least three depth encoded signals are read from a single photodiode. The pixels having stacked photo-sites with BCMD readout are particularly suitable for a CMOS image sensor that is illuminated from the back side.

7 Claims, 6 Drawing Sheets

STACKED PIXELS FOR HIGH RESOLUTION CMOS IMAGE SENSORS WITH BCMD CHARGE DETECTORS

CROSS REFERENCE TO RELATED APPLICATION

This application claims priority under 35 USC Sec. 119(e)(1) of provisional application No. 61/438,853 filed on Feb. 2, 2011.

BACKGROUND OF THE INVENTION

1. Field of the Invention

The disclosed invention relates to solid-state image sensors, and more specifically to CMOS image sensors that have two or more photo-sites stacked above each other resulting in a compact pixel layout having high sensitivity and low dark current.

2. Description of Related Art

Typical image sensors sense light by converting impinging photons into electrons that are integrated (collected) in sensor pixels. After completion of the integration cycle collected charge is converted into a voltage, which is supplied to the output terminals of the sensor. In CMOS image sensors the charge to voltage conversion is accomplished directly in the pixels themselves and the analog pixel voltage is transferred to the output terminals through various pixel addressing and scanning schemes. The analog signal can also be converted on-chip to a digital equivalent before reaching the chip output. The pixels have incorporated in them a buffer amplifier, typically the source follower, which drives the sense lines that are connected to the pixels by suitable addressing transistors. After charge to voltage conversion is completed and the resulting signal transferred out from the pixels, the pixels are reset in order to be ready for accumulation of new charge. In pixels that are using Floating Diffusion (FD) as the charge detection node, the reset is accomplished by turning on a reset transistor that momentarily conductively connects the FD node to a voltage reference. This step removes collected charge. However, it generates kTC-reset noise as is well known in the art. kTC noise has to be removed from the signal by the Correlated Double Sampling (CDS) signal processing technique in order to achieve a desired low noise performance. Typical CMOS sensors that utilize the CDS concept need to have four transistors (4T) in the pixel. An example of the 4T pixel circuit can be found in U.S. Pat. No. 5,991,184 to Guidash. By introducing switching pulses into the Vdd bias line it is possible to eliminate the select transistor from the pixel and achieve the CDS operation with only three transistors (3T) in the pixel as described by Masahiro Kasano in: "A 2.0 um Pixel Pitch MOS Image Sensor with an Amorphous Si Film Color Filter." Digest of Technical Papers ISCC, vol. 48, February 2005, pp. 348-349. The larger number of transistors in each pixel becomes a problem when the pixel size needs to be reduced in order to build low cost and high-resolution image sensors. Standard 3T pixels cannot use the CDS concept for kTC noise suppression and some other means must be used to minimize the adverse effects of this noise.

The color sensing in most single chip CMOS and CCD image sensors is accomplished by placing various light absorbing and color transmitting filters on top of the pixels in a predetermined pattern. The different pixels in a given pixel sub-group or a sub-array thus become sensitive only to a certain wavelength band of the spectrum. The pixel sub-groups thus form single color super pixels. The signal from the "color sensitive" sub-group pixels is then used to construct the color super-pixel signal using various interpolating and color signal processing methods in an attempt to recover the resolution that has been unavoidably lost in this scheme. An example of a typical color pixel pattern can be found for example in U.S. Pat. No. 3,971,065 to Bayer. Another example of the color filter arrangement can be found in the paper by Masahiro Kasano already mentioned above. All these approaches to color sensing have the principal disadvantage of sacrificing resolution as mentioned above and sacrificing sensitivity by the absorption of light in the various color filters.

An ingenious solution to this problem has been found and is already pursued by several companies, for example, by Foveon as can be learned in U.S. Pat. No. 6,894,265 to Merrill. In this approach three photodiodes are placed on top of each other inside the silicon bulk and the light generated carriers are collected at different depths depending on the impinging light wavelength. The voltage signal is then obtained by connecting these buried photodiodes to circuits located on top of the silicon chip surface where charge is sensed, processed, and reset in the usual way. The advantage of this approach is that no resolution is sacrificed by placing the color filter covered pixels side by side and no photons need to be absorbed in the color filters. However, it is not easy to form the photodiodes that are buried deep in the silicon bulk and also it is not without problem to sense charge collected in the buried photodiodes by circuits located on top of the silicon chip without adding noise.

In FIG. 1 the drawing 100 represents a cross section of the prior art pinned photodiode light-sensing element with a simplified schematic diagram of the associated pixel circuit. The pixel has the ability to separate charge according to its depth of generation and thus sense color. The p type silicon substrate 101 has Shallow Trench Isolation (STI) regions 102 etched in its surface and filled with a silicon dioxide 103. The silicon dioxide 103 also covers the entire surface of the pixel as in common in this technology. A shallow p+ doped region 104 passivates the walls and the bottom of the STI regions 102 as well as the surface of the pixel to minimize dark current generation. In this pixel, however, a p+ doped barrier 123 has been placed at a depth Xb 125 into the pixel. This barrier 123 separates the pixel into two distinct regions or photo-sites. The photo-generated charge 108 that is generated within the depth Xb (typically depleted) is collected and stored in the n type doped region 105 of the pinned photodiode. Charge 110 that is generated below the barrier 123 in the un-depleted region of the silicon diffuses around the barrier 123 into the edge of the depletion region 109 and is collected and stored in the FD 106. Since the depletion region has been made shallower than the depletion region of the typical pixel in this particular pixel concept, it is necessary to add charge cross talk barriers 124 into the structure to minimize the lateral charge diffusion and thus the pixel cross talk. Other means of cross talk prevention, such as making the STI isolation trenches deeper are well known to those skilled in the art. This pixel thus has the ability to detect and separately store charge that has been generated at different depths, according to the wavelength of light that has generated it, and thus inherently sense color without the necessity of light absorbing filters on top of the pixel. The circuit for processing the signals from this pixel is identical to the circuit of other 4T pixel designs. Transistor 118 resets the node 113 after transistor 114 has sensed its potential. Transistor 115 is the select transistor that connects the pixel signal to the column sense line 116. After charge collected in the FD region 106, which corresponds to light with longer wavelengths, has been sensed and reset the transfer gate (Tx) 107 is briefly pulsed to transfer charge collected in the pinned photodiode to the FD region 106. This charge corresponds to light with shorter wavelengths. The remaining control signals are supplied to the pixel via the reset gate bus (Rx) 120 and the address gate bus (Sx) 121. The conversion gain of this pixel is adjusted by selecting a suitable value for the capacitor (Cs) 119 that is connected between the node 113 and the node (Vdd) 117. When photons 122 impinge on the pixel, they penetrate into the silicon bulk depending on their wavelength and create the corresponding electron-hole pairs at that particular depth. This pixel thus has the ability to sense charge according to its depth of generation and thus sense color. As has been made clear in the above detailed description, this is accomplished without the necessity of forming an additional n type bulk charge storage region under the pinned photodiode. Only a potential barrier formed by the p+ type doped layer 123, which does not store charge has been added to the pixel. Charge generated below this barrier 123 is diverted away from the pinned photodiode and flows into a second storage region located at the surface of the silicon substrate. U.S. Pat. No. 7,737,475 to Hynecek, incorporated herein by reference, describes in more detail the above approach for building the CMOS color image sensors, which addresses these difficulties and provides a simpler and more practical solution for color sensing with less resolution loss than in the conventional approach and with minimum loss of light sensitivity. By placing the special potential barrier under the conventional pinned photodiode it is possible do divert the photo-generated carriers from the deep bulk region and direct them to flow in a narrow region to the surface of the silicon where they can be easily collected and stored for subsequent readout. The carriers from the bulk can thus be conveniently stored in a suitable structure next to the carriers generated and stored in the conventional photodiode near the silicon surface. It is thus not necessary to form buried photodiodes, collect and store charge deep in the bulk of the silicon, which is then difficult to access, read, and reset. It is also possible to place the special potential barrier in different depths in different pixels and thus make the pixels sensitive to different light spectral regions. Each pixel can thus provide two or more differently coded color signals instead of one. The resolution is not sacrificed as much as in the conventional approach and the light sensitivity is also not sacrificed, since no color absorbing filters, or not as many color absorbing filters are used. Storing all the photo-generated charge close to the silicon chip surface makes it possible to share some of the low noise readout and reset circuitry that is located there and thus achieve high performance with very small pixel sizes. This approach is thus much simpler and easier to implement in the current CMOS technology with high yield. However, it is important that the surface located second charge storage structures do not generate an excessive amount of dark current. This has not been achieved in the above cited patent to Hynecek where charge from the deep photo-site is stored on the FD or in the Source Follower MOS gate structure. Both of these charge storage structures are known to generate a large amount of dark current in comparison to a pinned photodiode. In addition the reset of the FD charge storage region is known to generate kTC noise.

SUMMARY OF THE INVENTION

It is an object of the present invention to overcome limitations in the prior art. It is the further object of the disclosed invention to provide practical CMOS image sensors with stacked photo-sites that sense color by separating photo-carriers by their depth of generation. Each pixel thus provides two or more color-coded signals instead of one without using the conventional light absorbing filters. Placing suitable potential barriers under the conventional pinned photodiode structure achieves this goal and other objects of the invention. Instead of using the traditional FD with the MOS Source Follower (SF) transistor, the invention utilizes a low dark current generating nondestructive charge detecting Bulk Charge Modulated Device (BCMD) in its place, which device also has the capability of storing charge and does not generate kTC noise. The pixels with stacked photo-sites, having one or two stacked barriers, are thus interfacing with one or more BCMD charge storing and sensing devices thus potentially eliminating the need for color filters while also increasing the sensor pixel density.

BRIEF DESCRIPTION OF THE DRAWINGS

The invention will be described in detail in the following description of preferred embodiments with reference to the following figures wherein.

DESCRIPTION OF THE PREFERRED EMBODIMENTS

Figure 1:
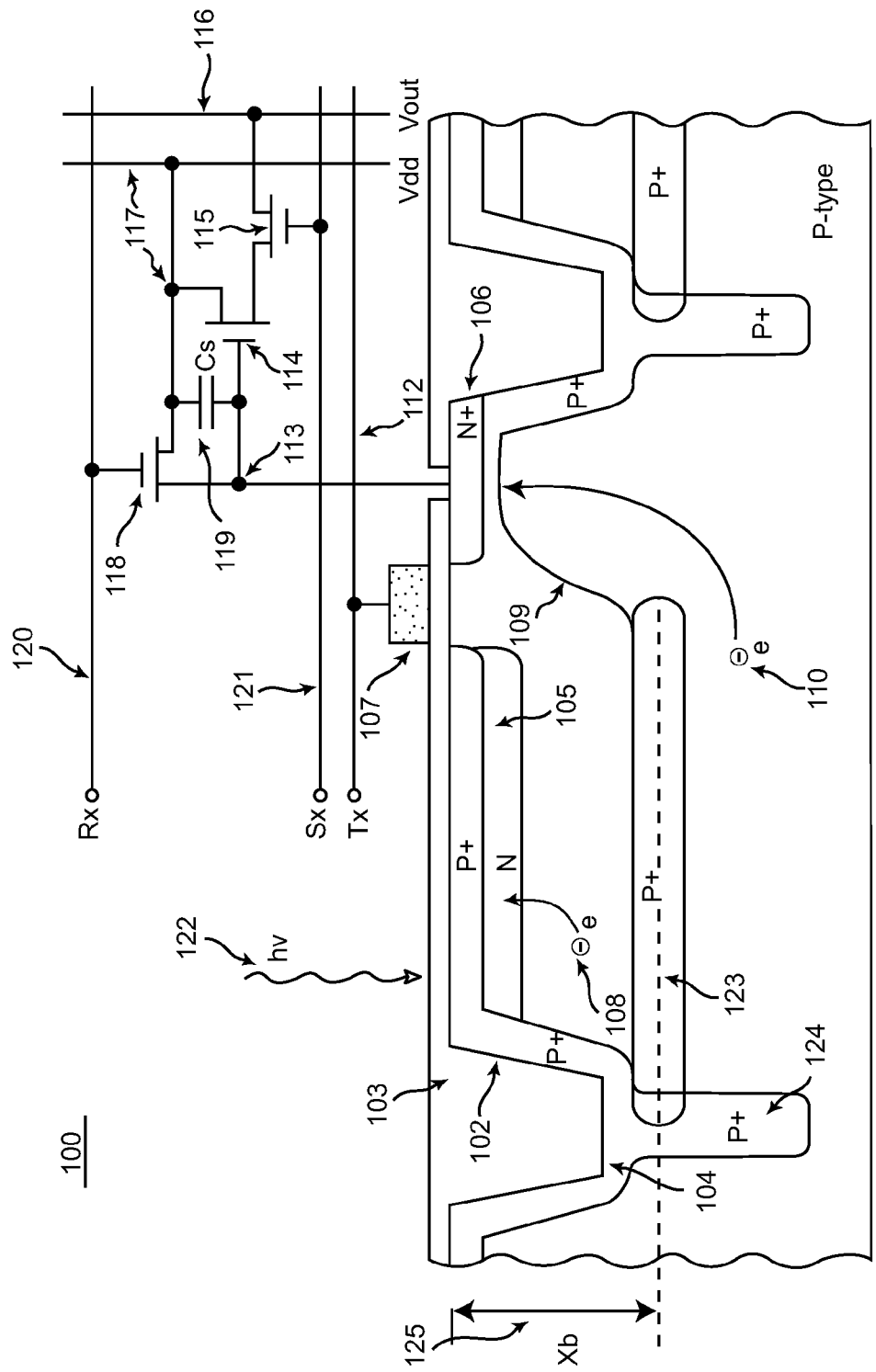
FIG. 1 shows the simplified cross section of a prior art stacked photodiode that is using FD as the second charge storage.
Figure 2:
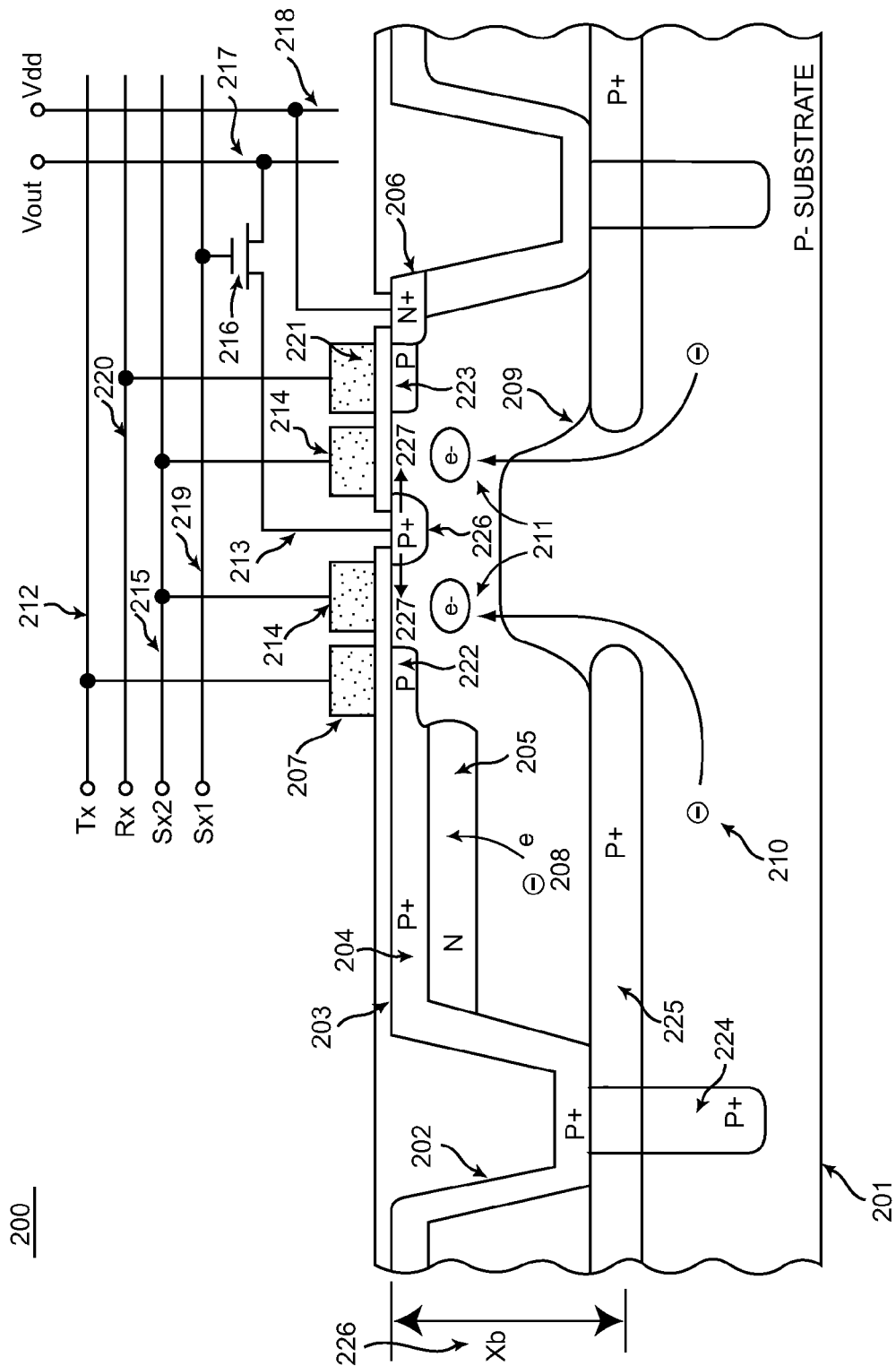
FIG. 2 shows the simplified cross section of a photo-site of the present invention and an associated simplified drawing of a BCMD device that has a pinned photodiode with an underlying potential barrier. The potential barrier separates the photo-generated carriers according to the depth of their generation and directs them to flow into different storage regions located near the surface or directly at the surface of the silicon. In this embodiment the pixel needs only four transistors for its operation.

In FIG. 2 the drawing 200 represents the simplified cross section of the present invention with stacked pinned photodiode light-sensing element and the associated pixel circuit. The stacked pixel with a plurality of photo-sites maintains the ability to separate charge according to its depth of generation, and thus senses colors. The p type silicon substrate 201 has Shallow STI regions 202 etched in its surface and filled with the silicon dioxide 203. The silicon dioxide 203 also covers the entire surface of the pixel as is common in this technology. A shallow p+ doped region 204 passivates the walls and the bottom of the STI regions as well as the surface of the pixel pinned photodiode to minimize the dark current generation. In this pixel, a p+ doped barrier 225 has also been placed at the depth (Xb) 226 into the pixel. This barrier 225 separates the pixel into two distinct regions or photo-sites. The photo-generated charge 208 that is generated within the depth Xb (that is typically depleted) in a first photo-site is collected and stored in the n type doped region 205 of the pinned photo-diode. Charge 210 that is generated in a second photo-site below the barrier 225 in the un-depleted region of the silicon diffuses around the barrier 225 into the edge of the depletion region 209 and is collected and stored in the BCMD well 211. Since the depletion region has been made shallower than the depletion region of the typical pixel in this particular pixel concept, it is necessary to add charge cross talk barriers 224 into the structure to minimize the lateral charge diffusion. Other means of cross talk prevention, such as making the STI isolation trenches deeper are well known to those skilled in the art. This pixel thus has the ability to detect and separately store charge that has been generated at different depths according to the wavelength of light that has generated it and thus inherently sense color without the necessity of light absorbing filters on top of the pixel.

The operation of the BCMD circuit is substantially different from the operation of the FD with the Source Follower (SF) transistor. During the integration period the BCMD gate 214 that has a circular shape and is surrounding the p+ doped source 226 is biased at a low potential, approximately −0.5V in order to attract holes to the silicon-silicon dioxide interface and quench the dark current generation. The bias is supplied to this gate 214 through the bus line 215. During this time the row select transistor 216 is turned off. The charge transfer gate 207 and the reset gate 221 are also biased low to prevent dark current generation by accumulating holes 222 and 223 beneath these gates. During the first readout cycle the gate 214 of the BCMD transistor is biased to a mid-level potential through the bus line 215 and the row select transistor 216 is turned on. The signal Sx1 is supplied to the row select transistor gate through the bus line 219. This causes the hole current 227 to flow in the BCMD device from the source 226 to the drain that is formed by the p+ region 204 surrounding the device and the regions of accumulated holes 222 and 223 under the transfer gate 207 and the reset gate 221. The source potential is sensed as the desired signal which is modulated by the presence of electrons in the BCMD well 211. The BCMD well has a circular (doughnut) shape following the shape of the gate 214. Current is supplied to the BCMD source 226 from the array periphery by a suitable current source through the bus line 217. After the source potential sensing using the array peripheral circuits has been completed, the row select transistor 216 is turned off, the BCMD gate 214 is returned to its low bias state, and the reset gate 221 is pulsed on and off. The signal is supplied to the reset transistor gate 221 through the bus line 220. This causes charge from the BCMD well to flow to the reset drain 206 and through the bus line 218 out of the pixel. After completion of the reset cycle the BCMD readout is repeated again, but now the BCMD well is empty and the voltage that is sensed on the source 226 represents the empty well reference. This value is then subtracted from the previous value sensed when the well had charge in it and this results in the subtraction of any BCMD transistor threshold non-uniformity that might have otherwise been included in the signal.

In the next cycle the BCMD gate bias is turned high and the Tx charge transfer gate 207 is pulsed on and off. After that the BCMD gate is returned to the mid-level bias again and the voltage on the source region 226 is sensed. The second sensing cycle is then followed by the reset cycle as previously described to subtract the BCMD threshold non-uniformity from the signal. It is also possible to use the previously sensed reset level as a reference in order to shorten the readout cycle. Charge can thus be removed without the reference readout. The array peripheral circuits thus accumulate two signals in their line memory, one corresponding to the deep generated electrons (red or yellow color signal) and the second signal corresponding to the shallow generated electrons (blue color signal). These signals are then converted to digital equivalents by a suitable column ADC converter and scanned out to the output terminals of the chip or to other on-chip digital signal processing circuits. After that the next line of double signal readout is ready for readout and processing.

Figure 3:
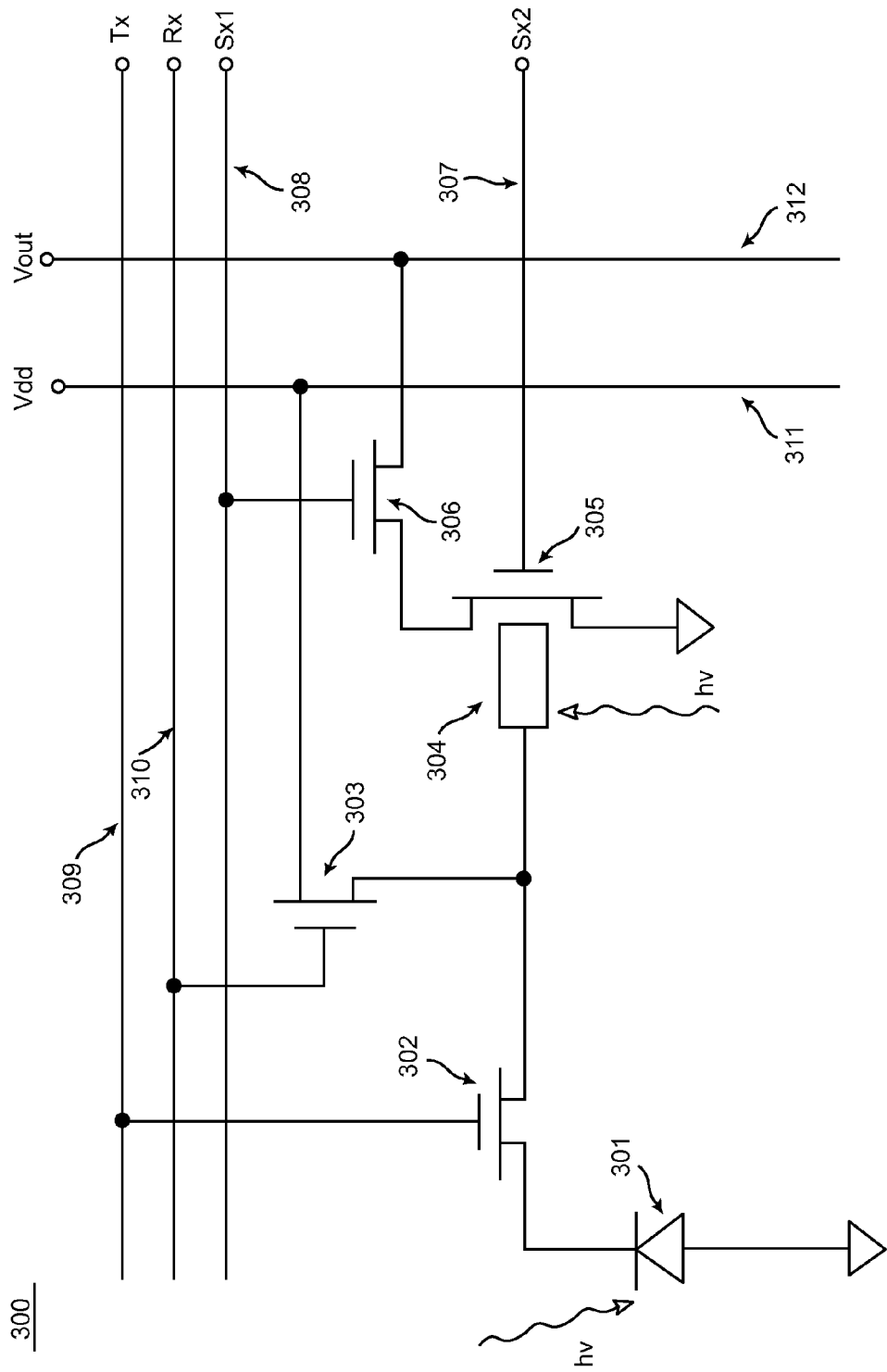
FIG. 3 shows the simplified equivalent circuit diagram of the pixel with the BCMD charge storage and readout device reading charge from a deep region of the stacked photodiode and a pinned photodiode that collects and stores charge generated in the shallow region of the stacked photo-site.

To better understand the operation of the stacked pixel photodiode with BCMD charge detector readout, a simplified pixel equivalent circuit diagram is shown in a drawing 300 in FIG. 3. The pinned photodiode 301 collects and stores electrons generated in the top shallow region of the stacked photodiode, while the BCMD well 304 collects and stores charge generated in the deep region of the photodiode. The regions are separated by an implant 225 located in a depth Xb 226 as shown in FIG. 2. Charge stored in the BCMD well 304 modulates the threshold of the BCMD transistor 305. The gate of the BCMD transistor 305 is controlled by the second row address line (Sx2) 307 and the output signal from the BCMD transistor is connected to the column bus line 312 via the address switch transistor 306 whose gate is controlled by the first row address line 308. Charge in the BCMD is reset via the reset transistor 303 whose gate is connected by the row reset line 310. The reset bias is supplied to the pixel via the column bus line 311. Charge from the top shallow photodiode region is transferred to the BCMD well via the charge transfer transistor 302 whose gate is controlled by the row charge transfer bus 309. It is also possible to eliminate some of the row bussing lines by adjusting the voltage thresholds in the BCMD transistor 305 and the addressing transistor 306, such that row address lines 308 and 307 can be merged into one. This is possible since the BCMD transistor is a p channel type and the row address transistor 306 is n channel type. It is also possible to implement some circuit component sharing between the pixels. For example the reset transistor 303 can be common to two or more neighboring lines or two or more neighboring pixels.

From this equivalent circuit diagram of FIG. 3 it is now easier to understand the pixel circuit operation. After enough charge has been integrated in the photodiode shallow and deep regions the readout sequence starts by turning the row select line (Sx2) 307 to its mid-level bias from its low level bias that was quenching the dark current generation. At the same time the row select transistor 306 is also turned on by changing the bias on the row select line (Sx1) 308. This results in a current flow in the BCMD transistor and a certain voltage corresponding to charge stored in the BCMD well 304 to appear on the output column bus 312. The current is supplied to the BCMD transistor from a current source located at the periphery of the array. After the readout has been completed by the peripheral circuits bias on the row select line is returned to its original level and the BCMD well is reset by pulsing the gate of the reset transistor 303 momentarily on. It is now possible to repeat the previous readout cycle and store the reference signal from the empty BCMD well in the peripheral circuits or wait after the readout from the shallow photodiode region has been completed. This is accomplished by turning the Sx2 line 307 to its high level bias and pulsing the gate of charge transfer transistor 302 momentarily high. After charge is transferred into the BCMD well the readout cycle can be repeated again as in the previous case of readout of charge from the deep photo-site region. This sequence of double readout and reset is repeated for each row of the array, so it is necessary that the peripheral circuits can store two or more lines of data. After this data is converted into the digital equivalent by a suitable column ADC the line data can be transferred in a serial fashion to the output terminals of the image sensor array or to other digital signal processing circuits located on-chip.

It is also possible to construct more complicated arrangements of stacked pixels with shallow pinned photodiode and two deep regions that have two BCMD charge storage and readout transistors collecting and reading charge from three distinct depths or photo-sites. This may correspond to reading the blue, green and red signals from a single pixel without using any color filter on top of the structure. This arrangement improves the sensitivity of the array, since there are no photons lost in the light absorbing color filters, and it also eliminates the color aliasing. An example of this embodiment of the invention is shown in a simplified device cross section shown in FIG. 4.

Figure 4:
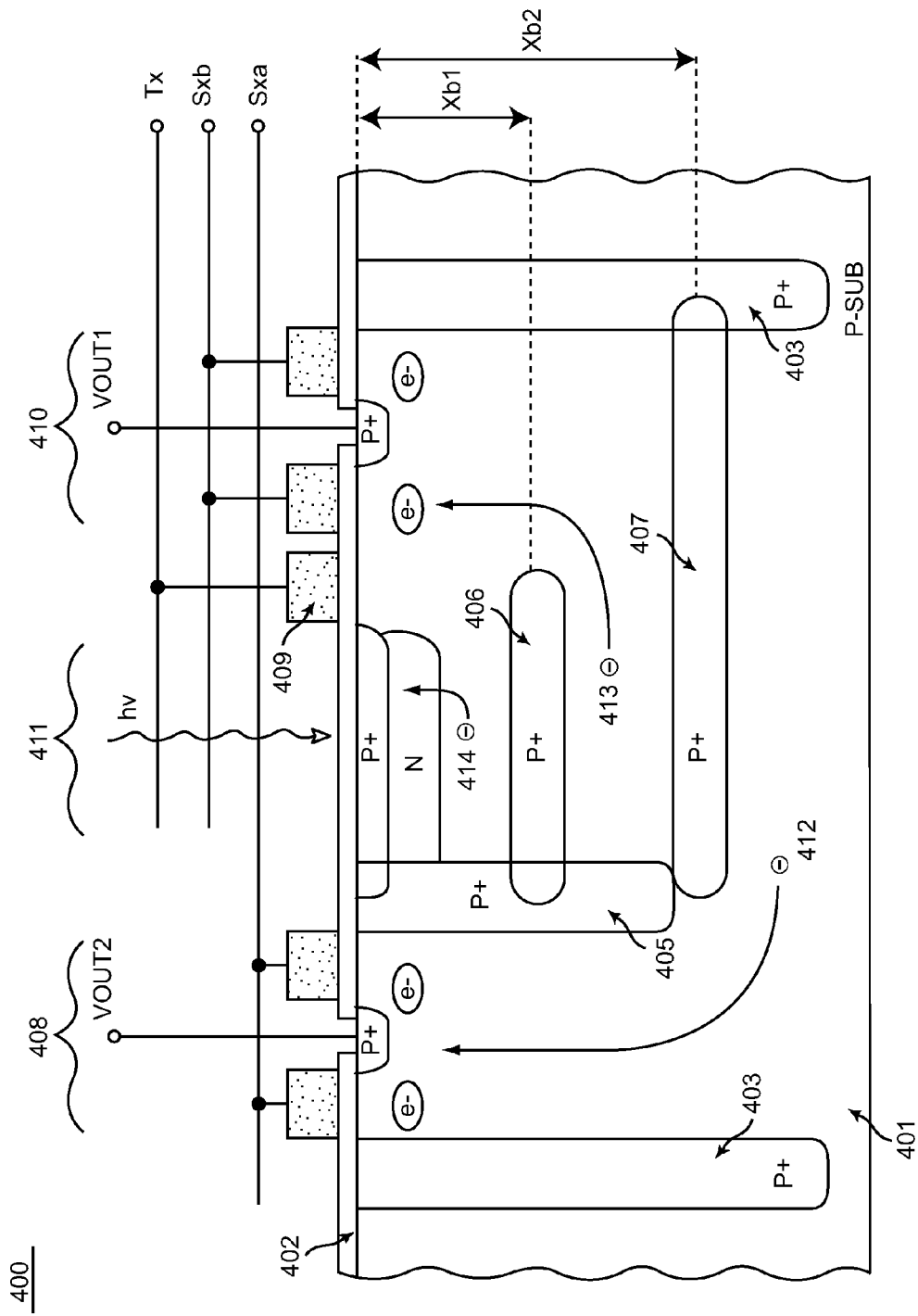
FIG. 4 shows another embodiment of the invention where the two BCMD charge storage and readout devices are adjacent to a single photodiode in a pixel having stacked photo-sites, that is capable of reading signals generated in three distinct depths of the silicon substrate. This pixel does not require any light absorbing color filters located on top of it, which simplifies its fabrication and improves its light detection sensitivity.

The drawing 400 in FIG. 4 represents a simplified cross section of a pixel having stacked photo-sites with three distinct depth regions in a substrate 401 wherein the photo-generated carriers are collected in separate locations on the surface of the pixel. For simplicity the reset transistor is omitted from the drawing, but it is present in the pixel in the direction perpendicular to the drawing plane. The surface of the substrate is covered by oxide 402 that serves as isolation for the BCMD gates. The pinned and stacked photodiode corresponds to the region 411. The diode interfaces through the transfer gate 409 with the first BCMD transistor 410. The horizontal separation from the second BCMD device 408 is accomplished by p+ doped regions 405 and 403. The vertical separation is accomplished by the p+ doped regions 406 and 407 located at different depths Xb1 and Xb2 respectively. As is apparent from the drawing electrons 412 generated deep in the silicon, generated by the red light, flow into the BCMD device 408 and are stored there. The electrons 413 generated in the intermediate depth, delineated by the barriers 406 and 407, and corresponding to a green light are collected in the BCMD device 410.

The blue light generates electrons 414 that are collected in the shallow region of the standard pinned photodiode and are transferred to the BCMD 410 via the transfer gate 409. The operation of this pixel is similar to that described for the previous embodiment with the exception that the line memory now needs to store three pockets of data for each pixel before the line is read out in a row direction. The readout and reset cycles are the same as before, just repeated for each BCMD device in a sequence.

Figure 5:
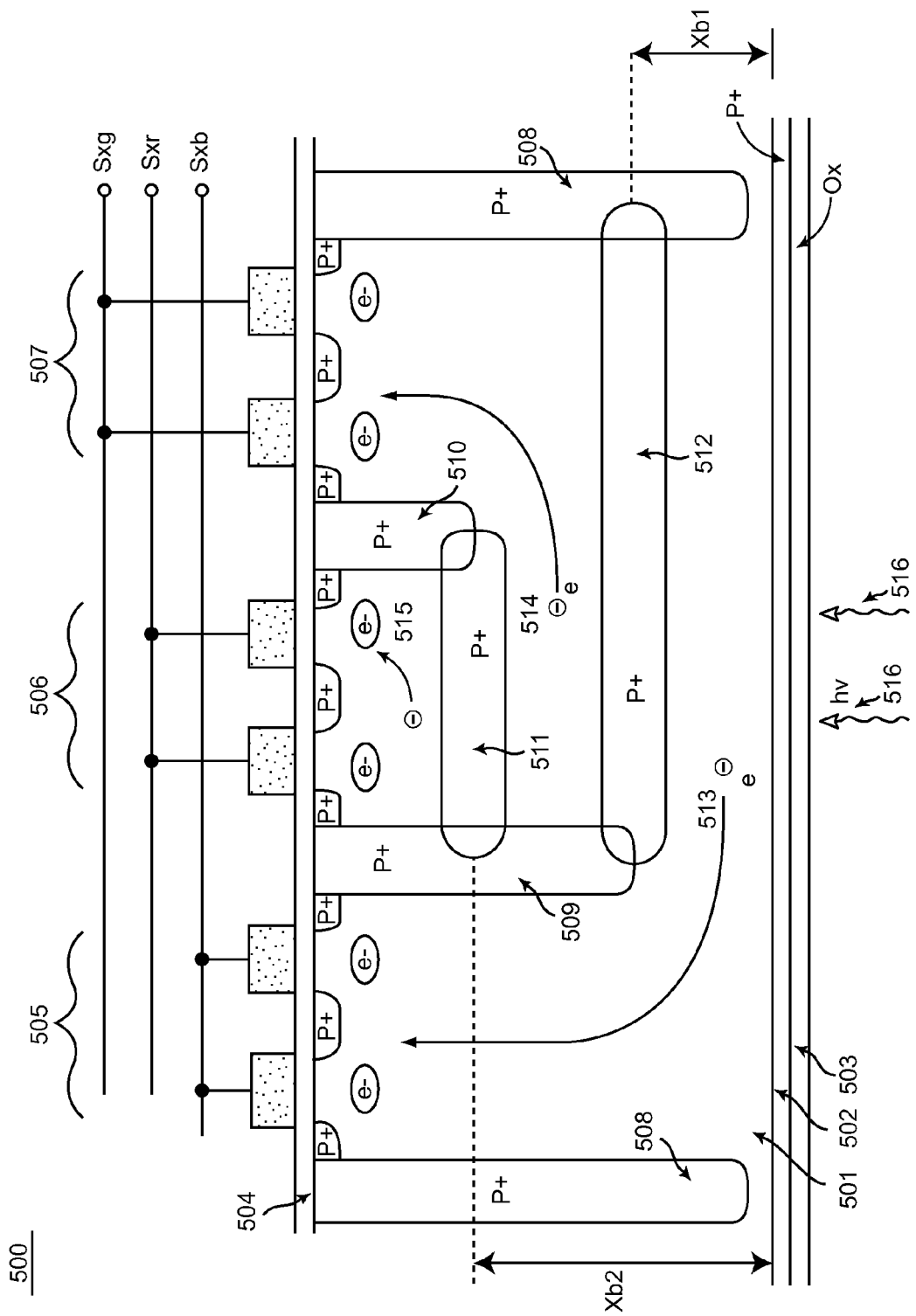
FIG. 5 shows yet another embodiment of the invention where three BCMD charge storage and readout devices are adjacent to a single photodiode in a stacked photo-site, which is illuminated from the back side of the chip. This arrangement also does not require any color filters for sensing and reconstruction of the color signal. An advantage here is high sensitivity and no color aliasing.

Yet another embodiment of the present invention is implemented using the simplified device cross section shown in FIG. 5. The drawing 500 consists of a p type doped substrate 501 that is illuminated from the back side by photons 516. The back surface is covered by a protective layer of dielectric 503 and the interface is doped by a suitable p+ doping 502 to reduce the dark current generation. The front surface is covered by oxide 504. The pixel consists of the three BCMD structures 505, 506, and 507 that are collecting electrons generated in various depths of the silicon. The BCMD transistor 505 collects electrons 513 generated by blue light, the BCMD transistor 507 collects electrons 514 generated mostly by green light, and the BCMD transistor 506 collects electrons 515 generated by red light. There is no pinned photodiode necessary and no transfer gate. The various color light sensing regions are separated vertically by the p+ barriers 511 and 512 and horizontally by the p+ barriers 508, 509 and 510. The operation of this pixel is similar to that described for the previous embodiment with the exception being that there is no transfer gate pulse necessary. The reset transistors are of course present in this device to remove charge from the BCMD devices after readout, but for simplicity they are not shown in this drawing.

Figure 6:
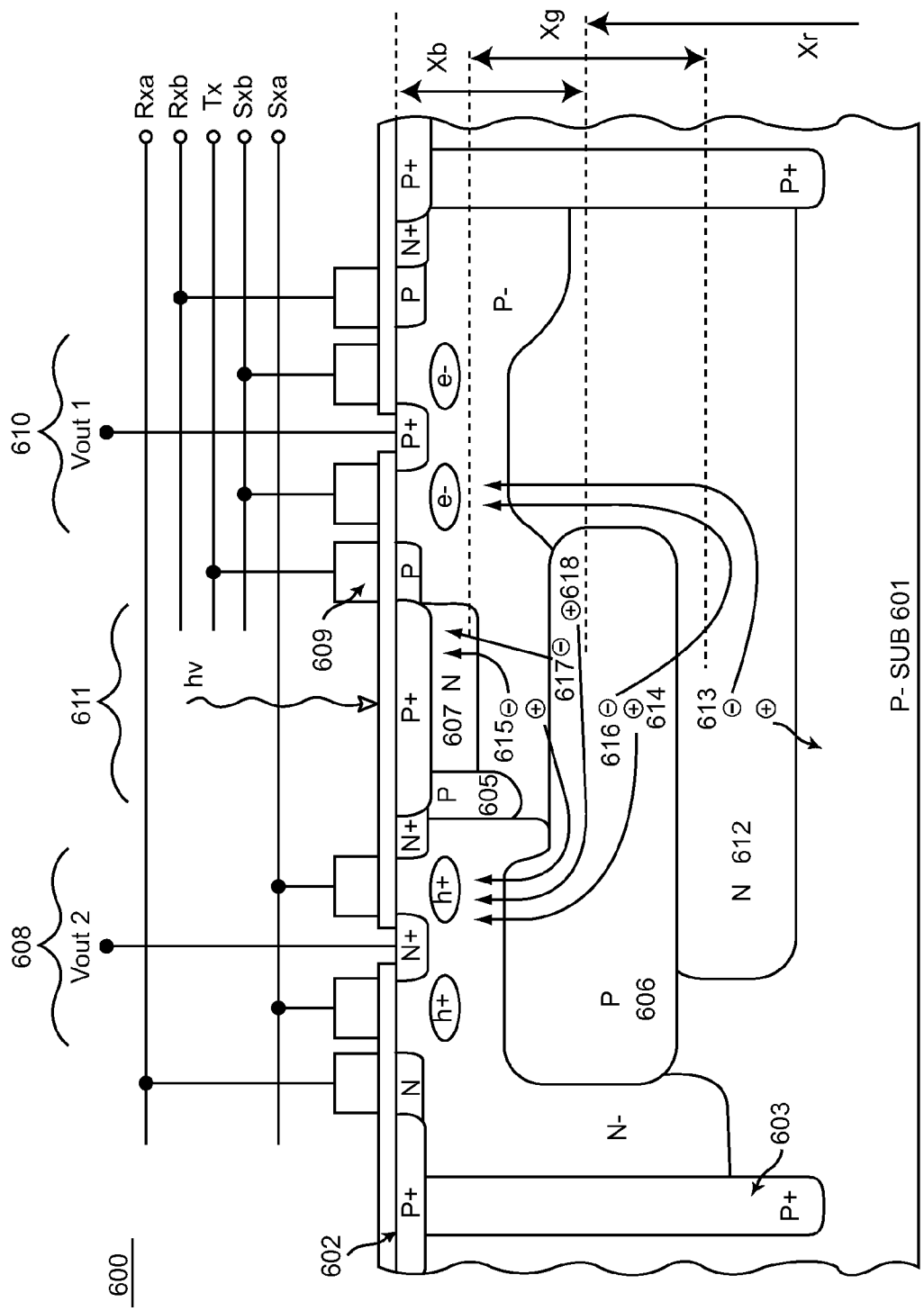
FIG. 6 show yet another embodiment of the invention which includes a pixel having three distinct depth regions in a substrate and which utilizes both electrons and holes for signal charges and collects the photo generated carriers in separate locations on the pixel surface.

Another embodiment of the present invention utilizes the simplified device cross section as shown in FIG. 6. The drawing 600 in FIG. 6 represents a simplified cross section of a stacked photodiode with three distinct depth regions in a substrate 601 collecting the photo generated carriers in separate locations on the surface of the pixel. This structure uses both electrons and holes for signal charges. The benefit is twice the amount of charge generated by photons, which means twice the sensitivity in response to green light within the Xg depth region in FIG. 6. For this application, the polarity of one of the two BCMD devices is changed to an N type channel transistor. The surface of the substrate is covered by oxide 602 that serves as isolation for the BCMD gates. The pinned and stacked photodiode corresponds to the region 611. The 3 layers of photodiodes are constructed with PNP, NPN, and PNP regions from top to bottom of the pixel. The photodiode interfaces through the transfer gate 609 with the first BCMD P type channel transistor 610. The horizontal separation from the second BCMD N type channel device 608 is accomplished by p+ doped region 603 and p doped region 605. The photodiode region of the second BCMD N type channel device 608 is accomplished by p doped region 606 which is an NPN type photodiode and collects photo-generated signal holes within the Xg depth of the silicon substrate. This photodiode also works for the vertical separation of PNP photodiode 607 which collects photo-generated signal electrons within an Xb depth of the silicon substrate and PNP photodiode 612 which collects photo-generated signal electrons within an Xr depth of the silicon substrate. As is apparent from the drawing electrons 613 generated deep in the silicon depth Xr, generated by the red light, flow into the BCMD P type channel device 610 and are stored there. The holes 614 generated in the intermediate depth Xg, delineated by the PNP photodiodes 607 and 612, and corresponding to a green light are collected in the BCMD N type channel device 608. The electrons 617 generated in the intermediate depth Xg and in the depth Xb flow into PNP photodiode 607. The electrons 616 in the intermediated depth Xg and in the depth Xr flow into the BCMD P type channel device 610. The photon generates an electron and hole pair and both are used for signal charges in the depth region Xg, thus providing twice the quantum efficiency in depth region Xg as in depth regions Xb and Xr. The blue light generates electrons 615 that are collected in the shallow region of the standard pinned photodiode and are transferred to the BCMD P type channel device 610 via the transfer gate 609. The operation of this pixel is similar to that described for the previous embodiment with the exception that the BCMD N type channel device 608 requires a different polarity for its operation and the line memory now needs to store three pockets of data for each pixel before the line is read out in a row direction. The readout and reset cycles are the same as before, just repeated for each BCMD device in a sequence.

There are many other combinations of the pinned photodiode arrangements with a plurality of BCMD readout detectors connected to a single stacked photodiode that can be used, for example, for motion detection and more complex color sensing. There are also various combinations of Xb barrier depths and various color filter arrangements with micro-lenses placed on the top or the bottom of the pixel, depending on the pixel illumination direction, which can be used for the color sensing. Alternatively, the micro-lenses may be placed on the top or bottom of the pixel without the use of color filters. These combinations will not be described here in any more detail, but are considered as part of this invention. The key and main points of the present invention that are novel are the pixel with stacked photodiode having multiple photo-sites which uses a BCMD device with a lateral reset structure for charge storage and simultaneously also for charge detection, which generates very little dark current, that is comparable to the dark current generated in pinned photo-diodes. The BCMD can be biased such that the silicon-silicon dioxide has accumulated holes in it produced during the charge integration and storage interval, which minimizes the dark current generation. The second advantage is that the BCMD can be reset completely with no charge left in the node, which prevents generation of kTC noise.

Having thus described preferred embodiments of a novel stacked pixel with a BCMD transistor charge storage and readout structure that are compact, have high sensitivity, and low dark current, which are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by appended claims.

Having thus described the invention with the details and particularity required by the patent laws, what is claimed and desired protected by Letters Patent is set forth in the appended claims.

What is claimed is:

1. An image sensor including an array of pixels, each pixel comprising:
   a plurality of Bulk Charge Modulated Device (BCMD) devices near the surface of a substrate;
   a plurality of vertically stacked photo-sites formed in the substrate for collection of photo-generated carriers, wherein the photo-sites are separated by a plurality of potential barriers;
   said pixel further being configured such that charge generated in each of said plurality of photo-sites, in accordance with the wavelength of impinging light, will be directed to flow to a corresponding one of said plurality of BCMD devices for storage and detection of the generated charge;
   said BCMD devices further being coupled to column sense lines through row addressing transistors for reading the charge stored in each of the plurality of BCMD devices; and
   reset transistors coupled to said plurality of BCMD devices for removing charge from said plurality of BCMD devices after charge readout.

2. The image sensor array of claim 1 wherein each pixel includes three separate photo-sites that are configured such that a first BCMD device collects electrons generated by blue light, a second BCMD device collects charge generated mostly by green light, and a third BCMD device collects charge generated by red light.

3. The image sensor array of claim 1 wherein said plurality of BCMD devices are p channel devices.

4. The image sensor array of claim 1 wherein the pixels having stacked photo-sites are configured such that the array may be illuminated from the back side of the substrate.

5. The image sensor array of claim 1 which further includes micro-lenses placed on top or bottom of the pixels depending on the pixel illumination direction.

6. The image sensor array of claim 5 which further includes color filters placed on top or bottom of the pixels depending on the pixel illumination direction.

7. The image sensor defined in claim 1 wherein the plurality of vertically stacked photo-sites in each pixel comprises:
   a first photodiode comprising PNP layers and disposed near the surface of the substrate;
   a second photodiode beneath said first photodiode consisting of NPN layers; and
   a third photodiode beneath said second photodiode consisting of PNP layers.

* * * * *